US005489876A

United States Patent [19]
Pernici

[11] Patent Number: 5,489,876
[45] Date of Patent: Feb. 6, 1996

[54] LOW-NOISE AMPLIFIER WITH HIGH INPUT IMPEDANCE, PARTICULARLY FOR MICROPHONES

[75] Inventor: Sergio Pernici, Bergamo, Italy

[73] Assignee: SGS-Thomson Microelectronics, S.r.l., Agrate Brianza, Italy

[21] Appl. No.: 987,151

[22] Filed: Dec. 8, 1992

Related U.S. Application Data

[63] Continuation of Ser. No. 669,898, Mar. 14, 1991, Pat. No. 5,170,133.

[30] Foreign Application Priority Data

Mar. 22, 1990 [IT] Italy ................... 19769 A/90

[51] Int. Cl.$^6$ ................... H03F 3/45
[52] U.S. Cl. ........... 330/253; 330/300; 381/120
[58] Field of Search ................... 330/253, 260, 330/261, 300; 381/120, 121

[56] References Cited

U.S. PATENT DOCUMENTS

| | | |
|---|---|---|
| 4,233,474 | 11/1980 | Hishinuma et al. . |
| 4,374,363 | 2/1983 | Previti . |
| 4,414,433 | 11/1983 | Horie et al. . |
| 4,473,794 | 9/1984 | Early et al. . |
| 4,521,741 | 6/1985 | Ruberl . |
| 4,629,910 | 12/1986 | Early et al. . |
| 4,833,422 | 5/1989 | Atwell ................... 330/300 X |
| 5,036,536 | 7/1991 | Hanon et al. . |

FOREIGN PATENT DOCUMENTS 2002980  2/1979  United Kingdom .

OTHER PUBLICATIONS

Patent Abstracts of Japan, vol. 12, No. 221 (E–625), Jun. 23, 1988.
Andreini, et al., "A New Integrated Silicon Gate Technology Combining . . . ", IEEE Trans. on Electron Devices, vol. 12, Dec., 1986, pp. 2025–2030.
Vittoz, "MOS Transistors Operated in the Lateral Bipolar . . . ", IEEE JSSC, vol. SC–18, No. 3, Jun. '83, pp. 273–279.
Pan, et al., "A 50–dB Variable Gain Amplifier . . . ", IEEE JSSC, No. 4, Aug. 1989, pp. 951–961.

*Primary Examiner*—James B. Mullins
*Attorney, Agent, or Firm*—Robert Groover; Betty Formby

[57] ABSTRACT

The amplifier includes a pair of bipolar input transistors (Q1, Q2), each having a base adapted to receive a differential input signal, a collector and an emitter which is biased by a first fixed current source (M7, M8) of its own and a degeneration resistor (R) which connects the emitters of the two bipolar transistors. The collector of each bipolar transistor is also biased by a second fixed current source (M5, M6) with a smaller current than that of the first source, and the collectors of the two bipolar transistors are furthermore connected to the input terminals of respective MOS amplifier devices (M1, M2, M3, M4, R$_L$). The amplifier can be made in BCD, BiCMOS or purely CMOS technology, in which case the bipolar transistors are obtained as lateral bipolar transistors.

22 Claims, 2 Drawing Sheets

LOW-NOISE AMPLIFIER WITH HIGH INPUT IMPEDANCE, PARTICULARLY FOR MICROPHONES

This is a continuation of application Ser. No. 07/669,898, filed Mar. 14, 1991, now U.S. Pat. No. 5,170,133.

The present invention relates to a low-noise amplifier with high input impedance. In one aspect the amplifier is particularly suitable for use as microphone amplifier in the field of telephony. The amplifier can be made in CMOS technology or in a mixed technology (BiCMOS, BCD) to be included in mixed analog and digital integrated circuits.

The recent evolution of circuit integration methods has allowed one to integrate an increasingly large number of analog and digital functions on a single integrated circuit. This is particularly evident in the field of telephony, in which it has recently become possible to combine in a single mixed integrated circuit (BCD, BiCMOS) digital functions in MOS technology and analog functions in bipolar technology.

However, as is known, bipolar technology is more expensive than MOS technology, occupies more area and dissipates more power, besides the fact that mixed technology is intrinsically complicated and therefore expensive. On the other hand, the use of analog functions or amplifiers in MOS technology is hindered by the higher noise which is typical of these circuits with respect to bipolar ones. Another hindrance is the low supply voltage which is generally available for said microphone amplifiers (since said voltage is drawn from the telephone line current).

The aim of the invention is therefore to provide an amplifier entirely or predominantly in CMOS technology, which has low noise and is thus suitable for being integrated as microphone amplifier in telephone circuits.

A further object is to provide said amplifier with high input impedance.

Another object is to provide said amplifier so that it can operate even with a low power supply voltage (even less than 3 V).

The invention achieves this aim, these objects and other objects and advantages such as will become apparent from the continuation of the description with a differential amplifier which comprises a pair of bipolar input transistors, each having a base adapted to receive a differential input signal, a collector and an emitter which is biased by a first fixed current source of its own, and a degeneration resistor which connects type emitters of said two bipolar transistors, characterized in that the collector of each bipolar transistor is also biased by a second fixed current source of its own, with a smaller current than that of said first source, and in that the collectors of said two bipolar transistors are furthermore connected to the input terminals of respective MOS amplifier devices. The invention is now described in greater detail with reference to some preferred embodiments, illustrated in the accompanying drawings, which are given by way of non-limitative example and wherein:

Figure 1:
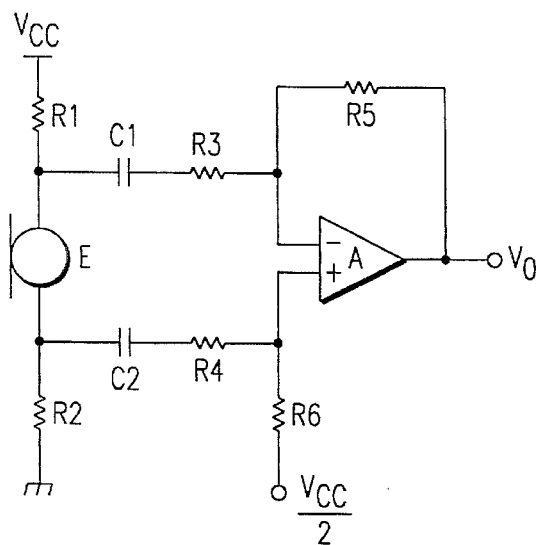
FIG. 1 is a circuit diagram of a microphone circuit according to the prior art.

With reference to FIG. 1, which illustrates a typical microphone circuit of the prior art, an electret microphone E with differential output, biased by resistors R1, R2, drives, through capacitors C1, C2 for direct-current insulation, the two inputs of an operational amplifier A, with input resistors R3, R4, a feedback resistor R5 and a bias, resistor R6. The amplifier A must have low noise and low distortion.

If the amplifier is manufactured in CMOS technology, it must be dimensioned with very large input transistors in order to have a low noise, with an undesirable area expenditure. Furthermore, since R3 and R4 must be much higher than the output impedance of the microphone (which is typically 1 kohm) in order to avoid signal attenuation, and since R5 must in turn be much higher than R3 and R4 (since the amplifier must provide an appreciable gain), this leads to a further considerable area expenditure, also due to the fact that said resistors must have a good linearity since they directly affect the linearity of the circuit. As is known, resistors manufactured with lower-resistivity materials are in fact the most linear; typically, polysilicon resistors, with a specific resistance of 20–30 ohm/per square, are much more linear than those with n-well or p-well diffusion, which have a typical resistance of 1–4 kohm/per square.

Figure 2:
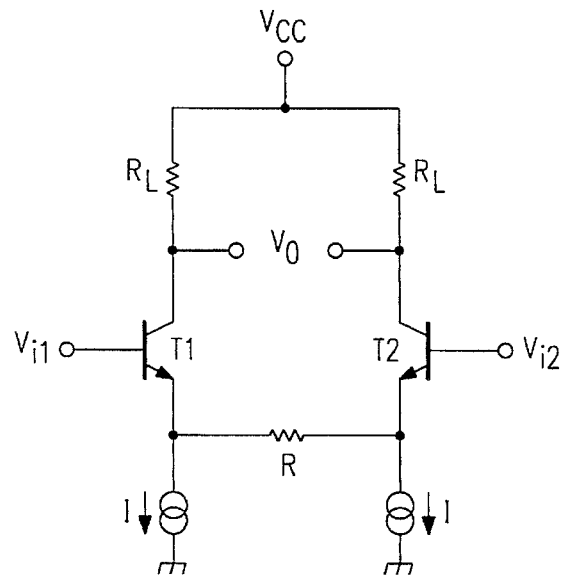
FIG. 2 is a circuit diagram of a bipolar microphone amplifier according to the prior art.

Another known solution of low-noise amplifier is illustrated in FIG. 2, and comprises a bipolar input amplifier formed by two transistors T1, T2, with collector resistors $R_L$ and with an emitter degeneration resistor R. The transistors T1, T2 are biased by fixed current sources I, which can be in either bipolar or CMOS technology. On the basis of the equivalent circuit for small signals, the following ratio can be easily obtained as gain of the amplifier:

$$2\beta R_L/(2r_{be}+\beta R)$$

where $\beta$ is the current gain of the bipolar transistors and $r_{be}$ is the total-base-emitter resistance. For high values of $\beta$, the gain is approximately $2R_L/R$. The input resistance is approximately $2r_{be}+\beta R$, if $\beta$ is not very large, and if an excessively large R is to be avoided, this value is relatively low.

Figure 3:
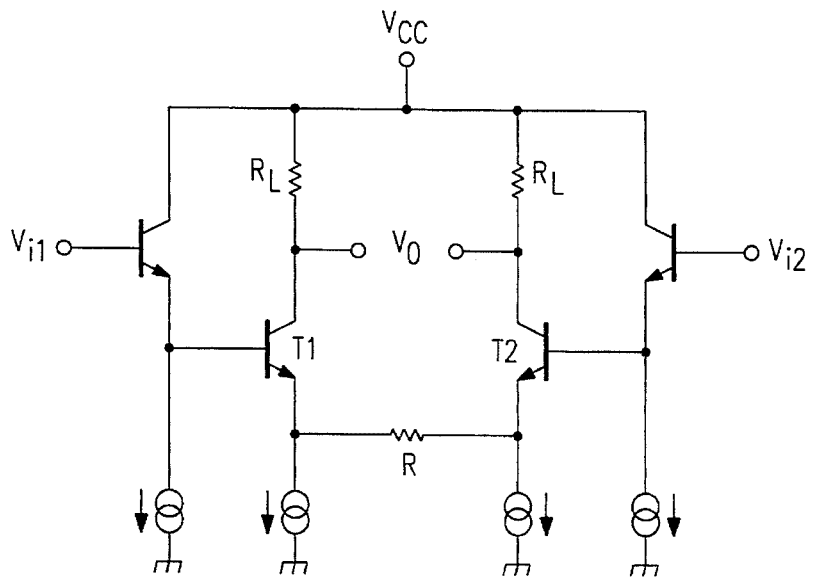
FIG. 3 is a circuit diagram of another bipolar microphone amplifier according to the prior art.

In order to obviate the problem of the low input impedance of the circuit of FIG. 2, it is known to modify the circuit according to the circuit of FIG. 3, in which two input transistors, with associated fixed current sources, have been added so as to form Darlington connections. The input impedance is thus increased, but the larger number of components inserted between the power supply and the ground also requires a higher minimum supply voltage, and the noise increases as well.

Figure 4:
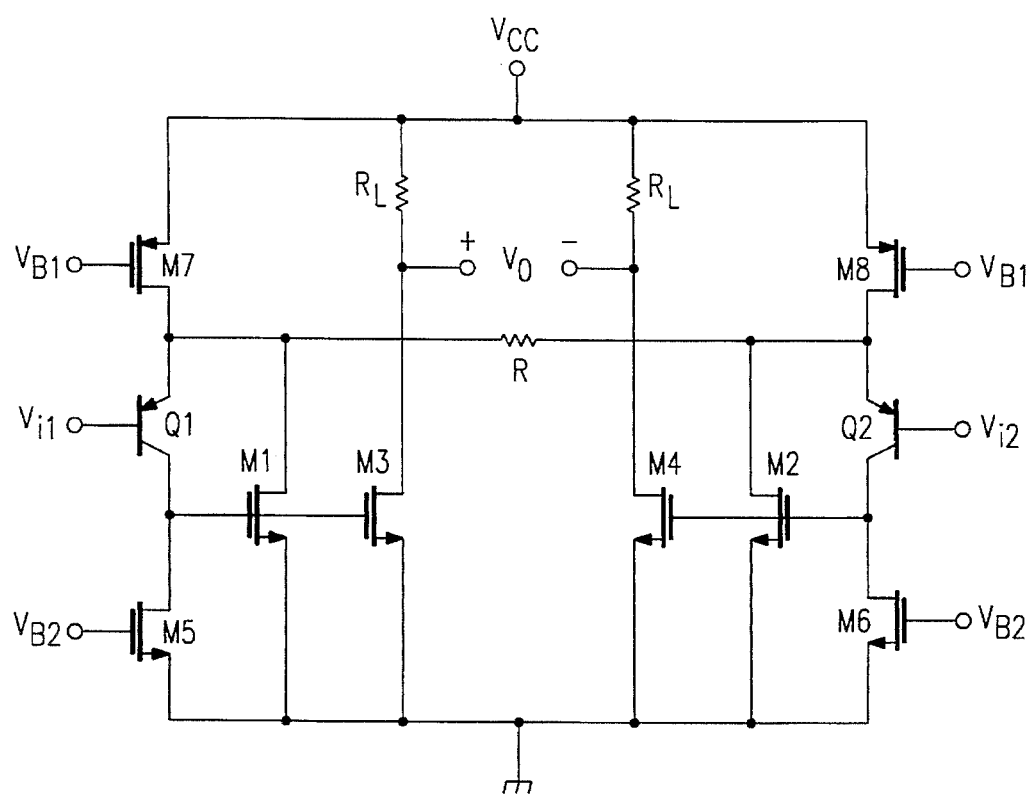
FIG. 4 is a circuit diagram of a microphone amplifier according to a preferred embodiment of the invention.

FIG. 4 illustrates an amplifier according to the preferred embodiment of the invention. Two CMOS transistors M1, M2 are driven by respective bipolar transistors Q1, Q2. Said bipolar transistors are biased by current sources M5, M6 on their collectors (adjusted by a fixed voltage $V_{B2}$) and by current sources M7, M8 on their emitters (adjusted by a fixed voltage $V_{B1}$). The current generated by M7 (or M8) is higher than the current generated by M5 (or M6), and the difference current flows in the transistor M1 (or M2). The emitters of Q1 and Q2 are connected by a degeneration resistor R. The currents which flow in M1 and M2 are mirrored in respective CMOS transistors M3, M4 and flow in respective load resistors $R_L$.

Each of the two pairs of MOS transistors M1, M3 and M2, M4, together with the associated load resistor $R_L$, thus constitutes a MOS amplifier device, and the two devices together form a differential amplifier stage.

When a differential signal $V_{i1}$, $V_{i2}$ is applied to the bases of the transistors Q1, Q2, said transistors behave like voltage followers. Therefore, ignoring second-order effects, a voltage equal to the input voltage $V_i = V_{i1} - V_{i2}$ occurs on the resistor R, with a current $V_i/R$, which flows almost exclusively in M1 and M2, since the currents in Q1 and Q2 are fixed by the sources M5 and M6 and vary to a negligible extent with the input signal. The current variations in Q1 and Q2 are in fact exclusively those required to vary the gate voltages of M1 and M2 (which are high-impedance points) so that these two MOS components absorb the current variation developed in R. It is evident that if the dimensions of M1 and M3 (and of M2 and M4) are identical, the differential voltage gain between the input and the output is very close to $2R_L/R$ even for rather low values of $\beta$. This value is the same which was obtained with the known circuit of FIG. 2, in which however $\beta$ was assumed to be very high. The circuit of FIG. 4 can therefore replace the one of FIG. 2, but with the advantage of a much higher input impedance. In fact, if one considers the circuit of FIG. 2, all of the signal current $I_R$ which flows in the resistor R due to the signal $V_i$ also flows in the input bipolar transistors: the base current to the signal in said bipolar transistors is therefore equal to $I_R/\beta$, where $\beta$ is the current gain of the bipolar transistors. In the circuit according to the invention, instead, only a small fraction of $I_R$ reaches the bipolar transistors (as mentioned above), and therefore the base current of said transistors is equal to the same fraction of $I_R$ divided by the $\beta$ of said transistors. The input impedance for small signals is therefore much higher. On the basis of the equivalent circuit for small signals, it can be easily checked that the input resistance $R_i$ of the amplifier of FIG. 4 is:

$$R_i = r_{be} + [(\beta+1) + g_{m1}r_{ds5}\beta]R/2$$

and the gain $V_o V_i$ is:

$$\frac{V_o}{V_i} = \frac{g_{m3}r_{ds5}\beta}{(2r_{be}/R) + (\beta+1) + g_{m1}r_{ds5}\beta} \cdot \frac{2R_L}{R}$$

where $g_{m1}$ and $g_{m3}$ are the transconductances of the MOS transistors M1 and M3 and $r_{ds5}$ is the resistance between the drain and the source of the MOS transistor M5. The value of $g_{m3}r_{ds5}$ is high (certainly higher than 100, provided that the MOS transistors are dimensioned appropriately), and is furthermore multiplied by $\beta$. The input impedance is therefore very high, and the gain is close to $2R_L/R$.

One of the advantages of the circuit according to the invention is that it can operate correctly even for very small power supply voltages, differently from the one of FIG. 3. The minimum voltage which can be used without making the devices leave their correct operation region is in fact lower than 2 volts. Distortion is also very low, since as mentioned the current variation due to the input signal $V_i$ in the bipolar input transistors is very small. Due to this reason, said devices operate in a very linear region, and the total distortion is dominated by the linearity of the emitter degeneration resistor.

Noise is only slightly higher than in an entirely bipolar circuit, since the dominant noise is that of the input transistors, which are indeed bipolar and therefore produce little noise, whereas the noise increase due to the MOS transistors is limited.

As seen above, the circuit according to the invention is made entirely with CMOS transistors and resistors, except for the two input bipolar transistors Q1 and Q2. The circuit can therefore be manufactured in mixed bipolar/CMOS technology, such as the so-called BCD technology, or also, in view of the absence of DMOS power transistors, in the simpler and less expensive BiCMOS technology. If one considers the fact that high performance is not required of the transistors Q1, Q2, said transistors can even be obtained more economically as lateral bipolar transistors within a purely CMOS technology, for example as described in the article "MOS Transistors Operated in the Lateral Bipolar Mode and their Application in CMOS Technology", by Eric A. Vittoz in *IEEE Journal of Solid-State Circuits*, vol. SC-18, no. 3, pages 273–279, June 1983. This possibility is one of the important advantages of the invention.

A preferred embodiment of the invention has been described, but it is understood that the expert in the field may devise other modifications and variations comprised within the scope of the inventive concept.

Where technical features mentioned in any claim are followed by reference signs, those reference signs have been included for the sole purpose of increasing the intelligibility of the claims and accordingly, such reference signs do not have any limiting effect on the scope of each element identified by way of example by such reference signs.

I claim:

1. An integrated circuit amplifier, comprising:

a matched pair of bipolar input transistors connected to receive an input signal, said input transistors having emitter and collector terminals of a first conductivity type, each said input transistor being connected to a respective constant current generator at said emitter thereof and to another respective constant current generator at said collector thereof;

a resistor connected between respective emitters of said pair of input transistors;

a matched pair of insulated-gate-field-effect transistors, having first and second source/drain terminals of a second conductivity type, each having a gate directly connected to said collector of one of said input transistors, and each connected to drive a respective load element and output terminal accordingly.

2. The amplifier of claim 1, wherein said first conductivity type is P-type.

3. The amplifier of claim 1, wherein each said input transistor is PNP, and each said field-effect transistor is N-channel.

4. The amplifier of claim 1, wherein each said input transistor is a lateral bipolar device.

5. The amplifier of claim 1, wherein each said input transistor is connected to a first power supply connection through an additional insulated-gate-field-effect transistor having source/drain regions of said first conductivity type.

6. The amplifier of claim 1, further comprising a second matched pair of insulated-gate-field-effect transistors each having first and second current-carrying terminals of said second conductivity type,, each having a gate connected to be controlled by the collector potential of one of said input transistors, and each being connected, together with said emitter of said one input transistor, to drive said respective end of said resistor.

7. The amplifier of claim 1, wherein each said load element is an additional resistor.

8. An integrated circuit amplifier, comprising:

a matched pair of bipolar input transistors each connected in a voltage follower configuration to receive an input signal at a base terminal thereof, and to drive a respective end of a resistor with a voltage which follows the input signal, said input transistors having emitter and collector regions of a first conductivity type;

a matched pair of insulated-gate-field-effect transistors, having source/drain regions of a second conductivity type, and each connected to drive a respective load element and output terminal accordingly;

each said input transistor also being connected to drive a gate of a respective one of said field-effect transistors in accordance with the voltage of said input signal; and a second matched pair of insulated-gate-field-effect transistors having respective source/drain regions of said second conductivity type, each having a gate connected to be controlled by the collector potential of said input transistor, and each being connected, together with said emitter of said respective input transistor, to drive said respective end of said resistor.

9. The amplifier of claim 8, wherein said first conductivity type is P-type.

10. The amplifier of claim 8, wherein each said input transistor is PNP, and each said field-effect transistor is N-channel.

11. The amplifier of claim 8, wherein each said input transistor is a lateral bipolar device.

12. The amplifier of claim 8, wherein each said input transistor is connected to a first power supply connection through a first current-regulating element, and is connected to a second power supply connection through a second current-regulating element.

13. The amplifier of claim 8, wherein each said input transistor is connected to a first power supply connection through an additional insulated-gate-field-effect transistor having source/drain regions of said first conductivity type.

14. The amplifier of claim 8, wherein each said load element is an additional resistor.

15. An integrated circuit amplifier, comprising: first and second circuit branches, each including:
 a bipolar input transistor connected in a voltage follower configuration to receive an input signal at a base terminal thereof, and having an emitter connected to drive a respective end of a resistor with a voltage which follows the input signal;
 a first field-effect transistor, having a gate connected to be controlled by the collector potential of said input transistor, and having a drain connected to drive said respective end of said resistor in accordance with voltage applied to said gate thereof;
 a second field-effect transistor, having a gate connected to be controlled by the collector potential of said input transistor, and having a drain connected to drive said a respective load element and output terminal in accordance with voltage applied to said gate thereof.

16. The amplifier of claim 15, wherein said first and second field-effect transistors are all mutually matched.

17. The amplifier of claim 15, wherein said bipolar transistors each have emitter and collector regions of a first conductivity type, and said field-effect transistors each have source/drain regions of a second conductivity type which is opposite to said first type.

18. The amplifier of claim 17, wherein said first conductivity type is P-type.

19. The amplifier of claim 15, wherein each said input transistor is PNP, and each said field-effect transistor is N-channel.

20. The amplifier of claim 15, wherein each said input transistor is a lateral bipolar device.

21. The amplifier of claim 15, wherein said input transistor is connected to a first power supply correction through a first current-regulating element, and is connected to a second power supply connection through a second current-regulating element.

22. The amplifier of claim 15, wherein each said load element is an additional resistor.

* * * * *